(12) United States Patent
Parandoosh

(10) Patent No.: US 6,657,447 B1
(45) Date of Patent: Dec. 2, 2003

(54) LIQUID CRYSTAL METHOD TO LOCALIZE METAL SHORT ON MULTI-LAYER METAL CMOS PROCESS

(75) Inventor: Seyed Amir David Parandoosh, Mountain View, CA (US)

(73) Assignee: Xilnx, Inc., San Jose, CA (US)

( * ) Notice: Subject to any disclaimer, the term of this patent is extended or adjusted under 35 U.S.C. 154(b) by 175 days.

(21) Appl. No.: 09/920,271

(22) Filed: Jul. 31, 2001

(51) Int. Cl.⁷ .................................................. G01R 31/02
(52) U.S. Cl. ............................... 324/760; 349/1; 349/2; 349/8
(58) Field of Search ........................ 324/760, 763, 324/765, 158.1, 750, 755, 770, 753; 438/5–17; 250/307; 349/1, 8, 24, 27, 2

(56) References Cited

U.S. PATENT DOCUMENTS

| | | |
|---|---|---|
| 3,872,050 A | * 3/1975 | Benton et al. ................. 260/37 |
| 4,682,857 A | 7/1987 | Tan |
| 5,561,293 A | * 10/1996 | Peng et al. .................. 250/307 |
| 5,777,487 A | 7/1998 | Burgess et al. |
| 6,121,059 A | 9/2000 | Liu |

\* cited by examiner

*Primary Examiner*—Kamand Cuneo
*Assistant Examiner*—Trung Nguyen
(74) *Attorney, Agent, or Firm*—Scott R. Brown; Edel M. Young; Justin Liu

(57) ABSTRACT

A chemical mixture of liquid crystal and a substance that lowers the clear/opaque transition temperature of the liquid crystal, thins the liquid crystal, and makes the liquid crystal more sensitive to heat generated in the lower layers of an integrated circuit chip during IC hot spot testing. The substance can be a solvent or a diluent comprising a ketone or an alcohol.

31 Claims, 3 Drawing Sheets

LIQUID CRYSTAL METHOD TO LOCALIZE METAL SHORT ON MULTI-LAYER METAL CMOS PROCESS

FIELD OF THE INVENTION

The present invention relates to integrated circuit liquid crystal hot spot testing. More particularly, the invention relates to a method for identifying failure sites on an integrated circuit chip by detecting hot spots.

BACKGROUND

In semiconductor fabrication, failure analysis is a crucial step to ensuring high yields of semiconductor devices from the manufacturing process. When an integrated circuit (IC) chip fails in service or testing, the nature and cause of the failure must be determined in order to prevent a recurrence of such a failure in the same or similar products.

An IC chip is typically built on a silicon substrate with multiple layers of insulating and conducting materials. Integrated circuit chips designed by Xilinx, Inc., assignee of the present invention, have six separate metal layers for making conductive interconnections between transistors, and more metal layers in the future are likely. This type of multi-layer structure is important in modern IC devices such as field programmable gate arrays, high density memory chips, microprocessors, and others in order to save chip real estate. The active devices are built upwards in many layers forming transistors, capacitors and other components.

When an IC device is found defective during product qualification, quality control testing, or while in service, various failure analysis techniques can be used to determine the cause of the failure. One of these methods utilizes liquid crystal's chemical response to heat for the identification of the failure site(s). This method is particularly useful for identifying short circuits between metal layers which generate heat in localized areas on a device. This method is also useful for locating leakage current problems that generate localized heat on a device.

The liquid crystal method entails coating a failing IC device with liquid-crystal, heating the liquid crystal to a temperature just below its clear/opaque transition temperature (i.e., the temperature above which liquid crystal blocks light in the visual spectrum), and exercising the failing IC device by applying voltage to the pads of the device. The failing device can either be a die on a wafer or a finished package. Wafer probes may be used to apply the voltage signals to a die, or bonding wires on a previously packaged device may be contacted to apply voltage signals to the device. A packaged device must be decapped to allow coating of the liquid crystal and observance of the device during the test.

When voltage is applied to the device, a short circuit or current leakage problem will cause localized heat generation. Because the liquid crystal is heated to just below its clear/opaque transition temperature, the localized elevated temperatures caused by the failure(s) increase the temperature of the liquid crystal in contact with the affected region above the transition temperature and cause it to change phases locally and become opaque. This clear/opaque transition can be observed by a failure analyst via an optical microscope or other viewing equipment used in a closed circuit computerized system with a monitor. Then, the region affected by the fault can be identified for further testing.

Although this liquid crystal hot spot method is cost effective and efficient at finding faults in IC chips, modern manufacturing processes are making the method less effective. As more layers of conductive and non-conductive materials are added into the semiconductor manufacturing process, the standard liquid crystal hot spot method described above is less able to find faults in lower layers of the IC device. This is because more material lies between the heat generating faults and the liquid crystal. As a consequence, it would be helpful to enhance the standard liquid crystal hot spot method by making liquid crystals more sensitive to heat caused by short circuits or leakage faults in the lower layers of an IC chip.

SUMMARY OF THE INVENTION

The present invention solves the above-described problems and provides a distinct advance in the art of integrated circuit chip failure analysis. More particularly, the present invention provides a chemical mixture of liquid crystal and a substance that lowers the clear/opaque transition temperature of the liquid crystal, thins the liquid crystal, and makes the liquid crystal more sensitive to heat generated in the lower layers of an IC chip.

The composition of the present invention broadly includes liquid crystal combined with a substance which lowers its clear/opaque transition temperature and makes it more sensitive to heat generated at lower levels of an integrated circuit chip. While the substance may be acting as a solvent or a diluent, it will be referred to throughout as a solvent. In one embodiment of the present invention, the substance is a ketone. In another embodiment of the invention the substance is an alcohol. In one separate aspect of the invention the ketone or alcohol can be mixed with a liquid crystal wherein the ketone or alcohol is less than approximately 50% by volume of the mixture. In another separate aspect of the present invention, the ketone or alcohol can be mixed with a liquid crystal wherein the ketone or alcohol is approximately 25–35% by volume of the mixture. In one embodiment, the substance is premixed prior to being applied to the device under test. In another embodiment the substance is mixed directly on the device under test.

By utilizing a mixture as described herein, numerous advantages are realized. For example, a mixture of liquid crystal and one of the substances disclosed herein reduces the clear/opaque transition temperature of the liquid crystal and thins the liquid crystal, making it more sensitive to heat generated in the lower layers of an IC chip. This greater sensitivity allows for better failure analysis of IC chips manufactured using modern processes.

These and other important aspects of the present invention are described more fully in the detailed description below.

BRIEF DESCRIPTION OF THE DRAWINGS

A preferred embodiment of the present invention is described in detail below with reference to the attached drawing figures, wherein.

Figure 1:
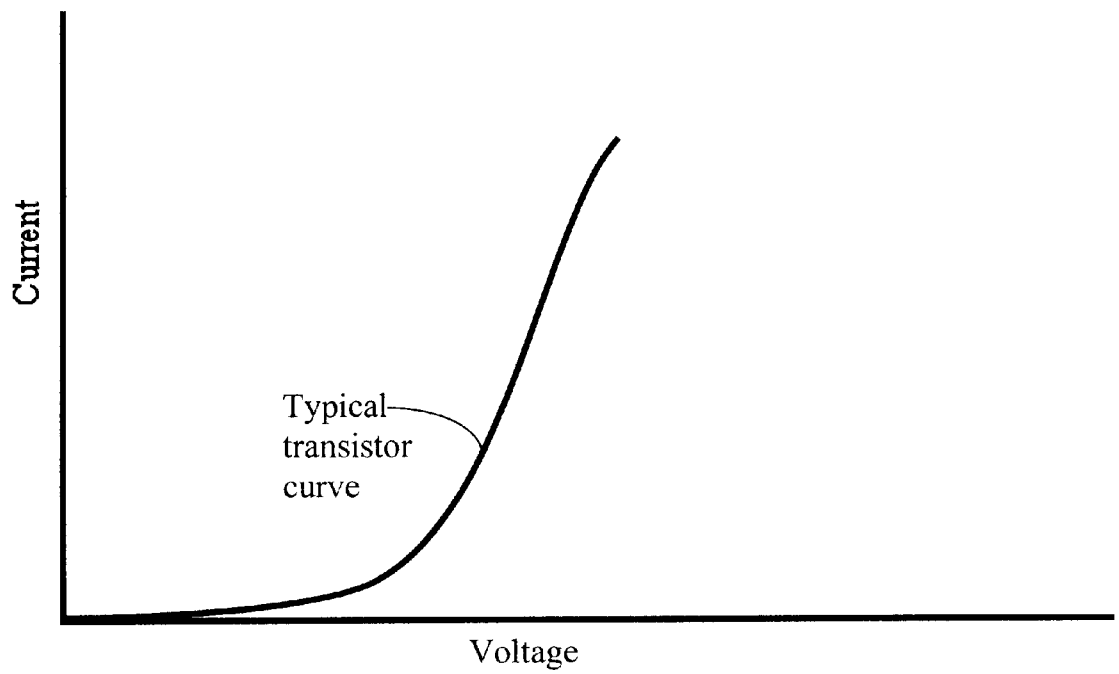
FIG. 1 is a graph of current versus voltage for a typical IC chip with transistors operating properly.

The drawing figures do not limit the present invention to the specific embodiments disclosed and described herein. The drawings are not necessarily to scale, emphasis instead being placed upon clearly illustrating the principles of the invention.

DETAILED DESCRIPTION

Figure 2:
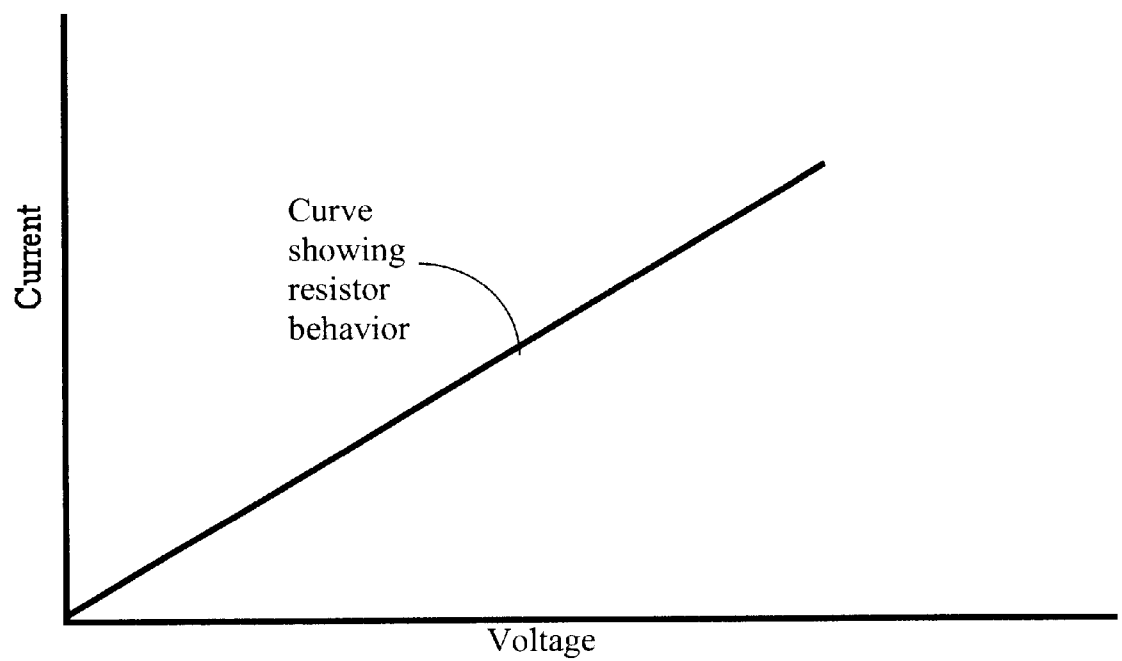
FIG. 2 is a graph of current versus voltage for an IC chip with a short circuit.
Figure 3:
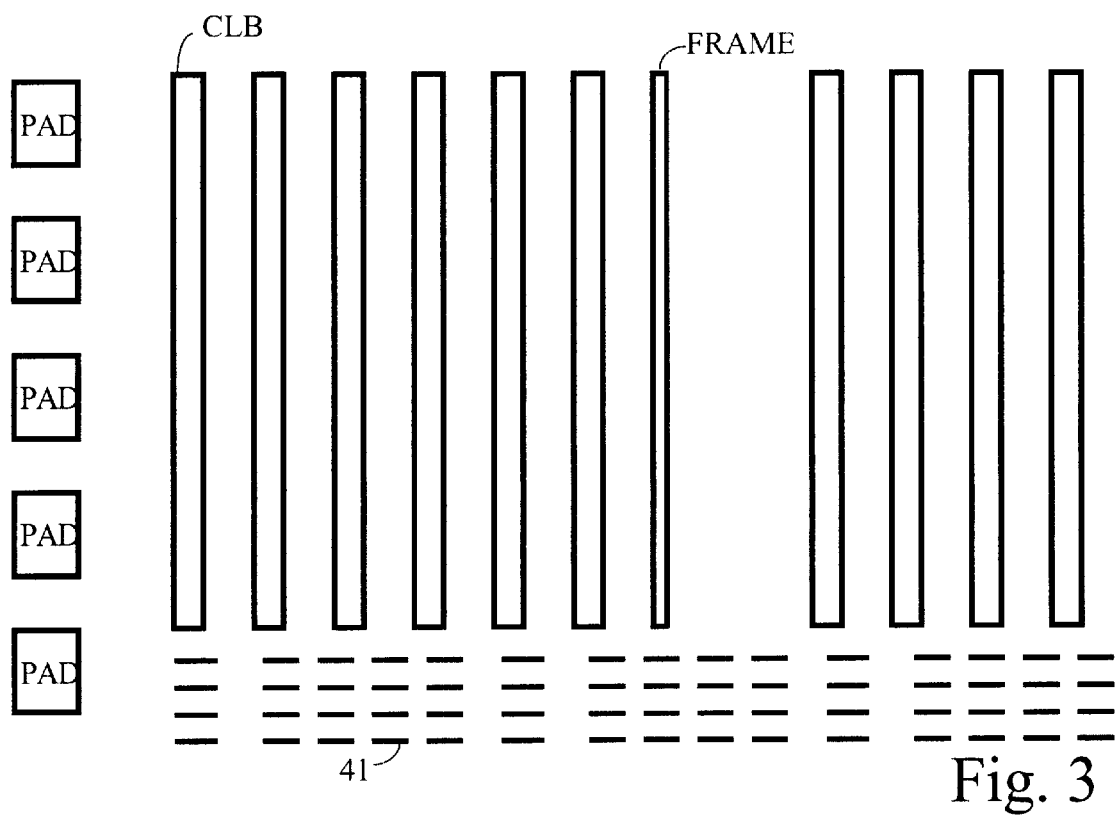
FIGS. 3 and 4 show portions of an FPGA containing a defect as seen under a microscope without and with electrical power being applied with liquid crystal mixture(s) applied on top.

When an IC device having many transistors operating normally is powered up, the current drawn by the device will increase in a non-linear manner, as shown in FIG. 1, as the voltage applied to the device is increased. However, if the IC device includes a metal-to-metal short, a portion of the device will show the linear curve characteristic of a resistor, as shown in FIG. 2. Therefore, such a curve suggests failure somewhere in the IC device. It is desirable to be able to locate these failure sites and pinpoint their causes.

The present invention discloses a method and composition for identifying failure sites on defective IC devices on wafers and in packages by utilizing a liquid crystal hot spot analysis technique in which the liquid crystal is mixed with a substance that thins the liquid crystal and lowers its clear/opaque transition temperature. The mixture is applied to a failing device and heated to just below its transition temperature. Voltage is then fed to the IC device to exercise the device. As the device is exercised, a short circuit or a leakage fault will generate heat such that the immediately adjacent liquid crystal mixture is heated past its transition temperature and the region of the liquid crystal mixture near the fault becomes opaque.

The present invention utilizes a unique property of the liquid crystal mixture for detecting failure sites on defective IC devices. The liquid crystal mixture goes through an opaque to clear transition at a specific transition temperature that is unique for the material. A hot spot, which is indicative of a failure site, is not generated under normal operations in an IC device. It is only generated when there is a short or a leakage fault in the circuit. The present novel method and composition can be used to pinpoint a localized failure site in the IC device even when the short circuit or leakage condition occurs several layers below the top layer on which the liquid crystal mixture is applied.

Figure 4:
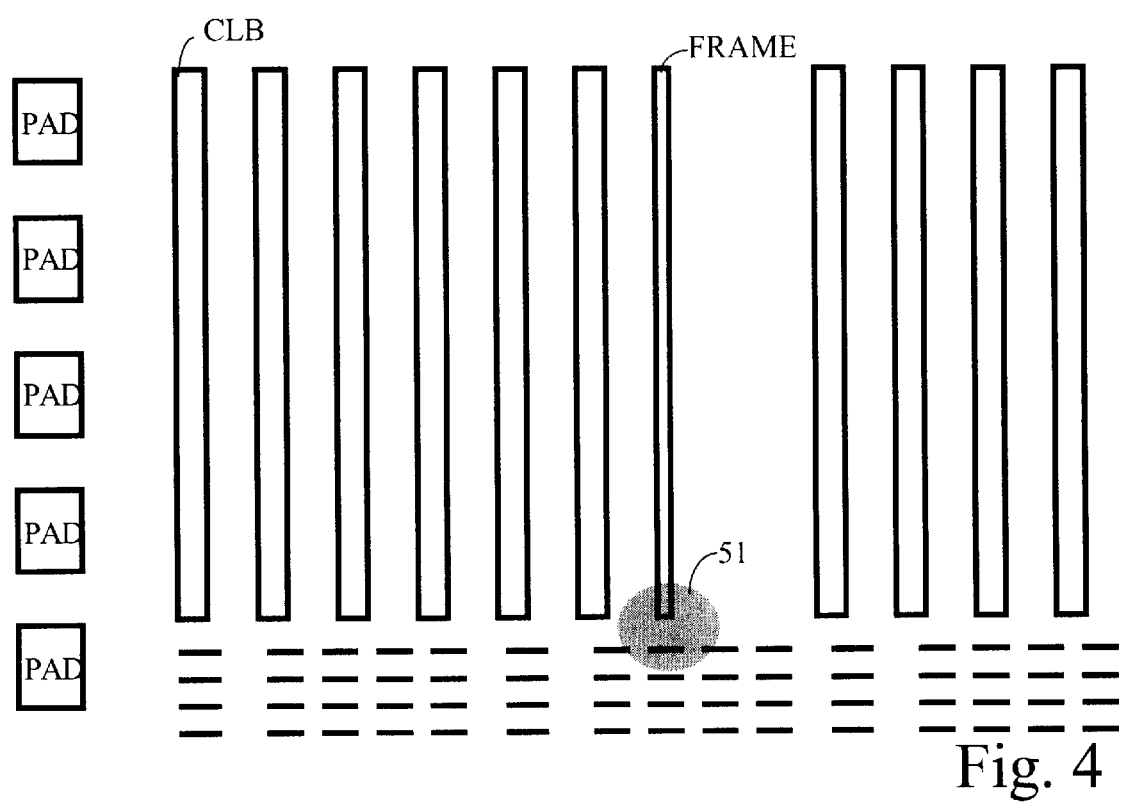

Some portions of an FPGA such as charge pumps may consume enough current in a small portion of chip real estate and generate heat such that the immediately adjacent liquid crystal mixture is heated past its transition temperature and the region of the liquid crystal mixture near the area becomes opaque. An analyst can easily distinguish such clear-to-opaque transition(s) from those which represent failure sites by applying this technique to a known good device to determine whether such transitions occur on a good device and/or by studying the circuitry and layout of the device under test. In the particular device of FIG. 4, a failure has caused a hot spot 51 to stand out, pinpointing the location of the failure.

Figure 5:
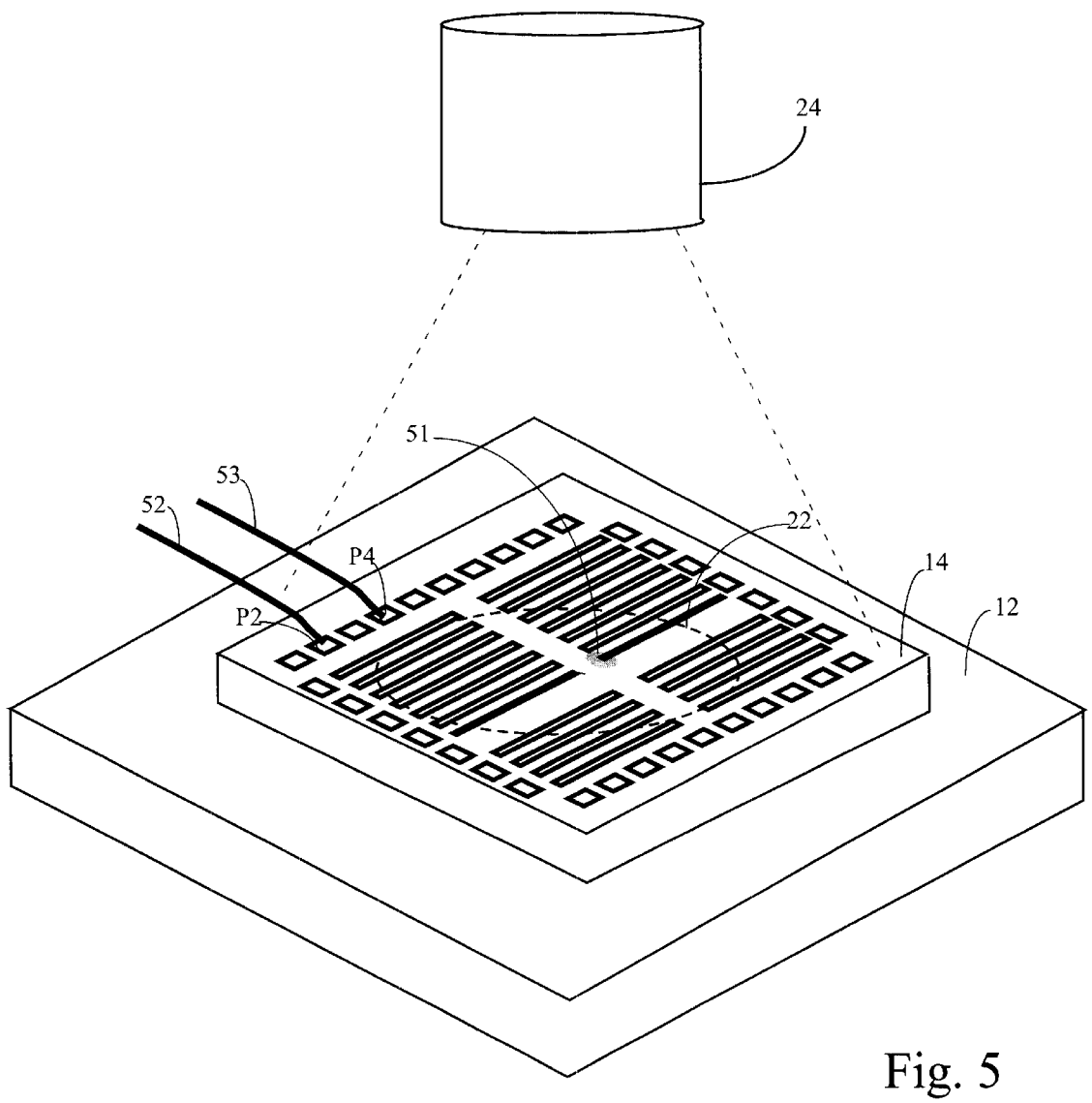
FIG. 5 is a perspective view of one apparatus capable of employing the method and composition of IC hotspot testing of the present invention.

FIG. 5 shows an apparatus for employing the method and composition of the present invention. The apparatus includes a heater 12. Positioned on top of the heater is an IC device 14. The device under test can either be a die on a wafer or a finished package. Wafer probes may be used to apply the voltage signals to a die via the bond pads, or external pins on a previously packaged device may be contacted to apply voltage signals to the device. The IC device 14 has a central circuit region in which active circuit elements are laid out on multiple layers of conducting and insulating materials. It should be understood that millions of transistors and connections between them may be present in this region. At the periphery of the circuit region are a plurality of bonding pads P2 and P4 (only a subset of the many pads typically present are shown) that are electrically connected to the circuitry of region 22 and to which probes 52 and 53 are connected during the testing process after the device 14 is manufactured and before packaging. A packaged device must be decapped to allow coating of the liquid crystal and observance of the device during the test. The bonding wires can be directly accessed through external package pins in a packaged device (not shown). A region 22 of the top layer IC device 14 is coated with the liquid crystal composition of the present invention. Although region 22 is shown covering less than all of circuit region 16 it can be spread across as much or as little of the circuit region as appropriate depending on the circumstances of the test. A microscope (preferably one with a polarized lens capability) 24 is placed above the device under test to observe for hotspots during the failure analysis process.

Because liquid crystal hot spot testing works best to detect the location of short circuits and current leakage faults, a preliminary step may be taken to analyze a failing device with a curve tracer. The curve tracer is used to bias the device under test by attaching it to the appropriate bonding pads or pins for a packaged device on the device (not shown). $V_{CC}$ supplied by the curve tracer is gradually increased while the analyst looks for a resistive path which is associated with a linear curve on the curve tracer as shown in FIG. 2. This method can be used to help isolate shorts and leakage faults for a particular signal line by placing power on a particular signal line with respect to another potential point. A linear curve on the curve tracer will be associated with a short circuit or leakage fault.

FIG. 1 depicts a typical characteristic transistor curve of current as a function of voltage. As expected, when ground and a gradually increasing power supply voltage are applied to the transistor, the curve is highly non-linear and represents a properly operating transistor or set of properly operating transistors. At low voltages, almost no current flows, and then at a voltage at which the transistor turns on, the current increases sharply.

By contrast, if there is a metal-to-metal short or other leakage structure between power and ground in the device, a linear curve such as shown in FIG. 2 will be displayed on the output of the curve tracer. If a linear curve is found, the device is a good candidate for IC hot spot testing to determine the exact location of the short or leakage fault.

Whether a curve tracer is used or not, the hot spot method proceeds as follows. The method is performed by first mixing liquid crystal with a substance that lowers the clear/opaque transition temperature of the liquid crystal. This substance may be a solvent or a diluent. While there are many acceptable liquid crystals commercially available, a substance sold under the name "A1" from Technology Associates of Portola Valley, Calif. was used in developing the present invention. It has been found that a member of the ketone group, acetone, works well to mix with the liquid crystal to achieve the desired result. In mixing the liquid crystal and the acetone, the mixture should comprise less than 50% by volume of acetone. Preferably, the acetone should comprise 25–35% of the mixture by volume to achieve the best results in lowering the transition temperature and making the mixture sensitive to heat changes on a device while still maintaining enough liquid crystal to be effective in the testing process. At present, a 30% mixture by volume of acetone is preferred. Alcohol has also been tested and found to achieve the same,results as acetone, using the same concentrations as described above. In one experiment, isopropyl alcohol was used in the above referenced volumes to achieve the desired results.

It is not necessary to premix the liquid crystal and substance that lowers its transition temperature. The method will work when the mixture is created prior to applying to a device under test and has also been found to work by first applying the liquid crystal to the device and then mixing the substance with the liquid crystal while on top of the device.

After the composition is applied to the device in region 22, the heater 12 or hot chuck on which the device is sitting is energized to raise the temperature of the liquid crystal composition to just below its clear/opaque transition temperature. Once in this state, only a small amount of heat is needed for the liquid to change its phase from clear to opaque. Next $V_{CC}$ voltage is applied to device 14 and the device is exercised while being examined through microscope 24 to see if there are any spots where a clear-to-opaque transition is occurring. As shown in FIG. 5, one hot spot 51 indicates that an electrical short or leakage has occurred. During such testing, after the liquid crystal at location 51 transitions from clear to opaque, heat flows from the hot spot to the remainder of the liquid crystal, thereby dissipating the heat in the localized region. The localized region then transitions back to clear again. As the test continues this area will transition from clear to opaque and back again as it heats and cools. The failure analyst can look for spots where the liquid crystal is flashing clear to opaque and back again as the failure analyst applies and removes the voltage.

In another embodiment the heating step is altered by heating device 14 until all of the liquid crystal composition on the die has transitioned to opaque and then the heating element is turned off. Power is simultaneously supplied to the suspect area. As device 14 cools, the liquid crystal transitions to clear except in the region immediately adjacent to any defective areas. In those regions heat form the fault causes the liquid crystal composition to remain in its opaque state.

Once a hot spot has been identified, typically it will be marked in some fashion upon four sides so that the hot spot region can be further analyzed to identify the particular fault. This marking can be by applying a dye to areas directly adjacent to the fault, by drilling holes on four sides surrounding the affected region, or by marking the area with a laser that is used to penetrate deep holes to mark the area permanently for later processing purposes and study. Subsequent processing includes stripping the layers of conducting and insulating materials on the IC chip until the fault is found. Typically a scanning electron microscope is used in this process to help identify the fault. In operation, the method of the present invention has been found to be 99% effective in identifying fault regions in IC chips having six metal layers.

The above description of the invention is intended to be illustrative and not limiting. Other embodiments of this invention will be obvious to those skilled in the art in view of the above disclosure.

What is claimed is:

1. A method of locating faults in an integrated circuit device comprising the steps of:
   applying a mixture comprising liquid crystal and a compatible solvent to a device under test, the mixture having a clear/opaque transition temperature lower than the transition temperature of the liquid crystal;
   heating the mixture to a temperature just below the clear/opaque transition temperature of the mixture; and
   applying a signal to the device under test and detecting hot spots.

2. The method of claim 1 wherein the solvent is an alcohol.

3. The method of claim 1 wherein the solvent is a ketone.

4. The method of claim 3 wherein the ketone is a $C_3$–$C_{10}$ ketone.

5. The method of claim 1 wherein the solvent is acetone.

6. The method of claim 1 wherein the solvent is isopropyl alcohol.

7. The method of claim 1 wherein the mixture comprises less than about 50% by volume of solvent.

8. The method of claim 7 wherein the mixture comprises about 25–35% by volume of solvent.

9. The method of claim 1 wherein the mixture comprises approximately 30% by volume of solvent.

10. The method of claim 1 further comprising the step of monitoring the device under test with a curve tracer.

11. The method of claim 10 wherein the step of monitoring comprises analyzing for a linear curve on an output of the curve tracer.

12. A structure for integrated circuit hot spot testing comprising:
    a) a mixture comprising:
       1) a liquid crystal; and
       2) a solvent capable of reducing the clear/opaque transition temperature of the liquid crystal; and
    b) an integrated circuit chip having a surface coated with the mixture.

13. The structure of claim 12 wherein the solvent is an alcohol.

14. The structure of claim 12 wherein the solvent is a ketone.

15. The structure of claim 12 wherein the solvent is a $C_3$–$C_{10}$ ketone.

16. The structure of claim 12 wherein the solvent is acetone.

17. The structure of claim 12 wherein the solvent is isopropyl alcohol.

18. The structure of claim 12 comprising less than about 50% by volume of the solvent.

19. The structure of claim 12 comprising about 25–35% by volume of the solvent.

20. The structure of claim 12 comprising about 30% by volume of the solvent.

21. A method of locating faults in an integrated circuit device comprising the steps of:
    applying a mixture comprising liquid crystal and a compatible solvent to a device under test, the mixture having a clear/opaque transition temperature lower than the transition temperature of the liquid crystal;
    activating a heater to heat the mixture to a temperature just above the clear/opaque transition temperature;
    applying a signal to the device under test; and
    deactivating the heater and detecting hot spots.

22. The method of claim 21 wherein the solvent is an alcohol.

23. The method of claim 21 wherein the solvent is a ketone.

24. The method of claim 21 wherein the solvent is a $C_3$–$C_{10}$ ketone.

25. The method of claim 21 wherein the solvent is acetone.

26. The method of claim 21 wherein the solvent is isopropyl alcohol.

27. The method of claim 21 wherein the mixture comprises less than about 50% by volume of solvent.

28. The method of claim 21 wherein the mixture comprises about 25–35% by volume of solvent.

29. The method of claim 21 wherein the mixture comprises about 30% by volume of solvent.

30. The method of claim 21 further comprising the step of monitoring the device under test with a curve tracer to identify whether a short circuit is a likely cause of the fault.

31. The method of claim 30 wherein the step of monitoring-comprises analyzing for a linear curve on the curve tracer output.

* * * * *

UNITED STATES PATENT AND TRADEMARK OFFICE
CERTIFICATE OF CORRECTION

PATENT NO. : 6,657,447 B1  
APPLICATION NO. : 09/920271  
DATED : December 2, 2003  
INVENTOR(S) : Seyed Amir David Parandoosh Page 1 of 1

It is certified that error appears in the above-identified patent and that said Letters Patent is hereby corrected as shown below:

On the title page, item (73) Assignee "Xilnx, Inc., San Jose, CA (US)" should read --Xilinx, Inc., San Jose, CA (US)--

Signed and Sealed this
Twentieth Day of August, 2013

Teresa Stanek Rea
*Acting Director of the United States Patent and Trademark Office*